United States Patent [19]

Hatcher

[11] Patent Number: 4,797,635
[45] Date of Patent: Jan. 10, 1989

[54] TRACKING LOOP HAVING NONLINEAR AMPLITUDE FILTER

[75] Inventor: G. Stephen Hatcher, Kent, Wash.

[73] Assignee: The Boeing Company, Seattle, Wash.

[21] Appl. No.: 48,635

[22] Filed: May 11, 1987

[51] Int. Cl.[4] .............................................. H03L 7/06
[52] U.S. Cl. .......................................... 331/17; 331/25
[58] Field of Search ....................... 331/1 A, 15, 17, 18, 331/25

[56] References Cited

U.S. PATENT DOCUMENTS

| | | | |
|---|---|---|---|
| 3,597,541 | 8/1971 | Proakis et al. | 178/88 |
| 4,322,811 | 3/1982 | Voorman | 364/825 |
| 4,323,980 | 4/1982 | Houdard et al. | 364/724 |
| 4,333,158 | 6/1982 | Voorman | 364/825 |
| 4,431,976 | 2/1984 | Voorman | 333/166 |
| 4,507,578 | 3/1985 | Matsuda | 307/520 |

OTHER PUBLICATIONS

Jack K. Holmes, *Coherent Spread Spectrum Systems*, John Wiley & Sons, 1982, pp. 53–65, 97–103, 121–123, 129–145.

James K. Spikler, Jr. *Digital Communications By Satalite*, Prentice-Hall, 1977, pp. 295–305, 347–365.

Gray & Meyer, pp. 561–591.

*Primary Examiner*—Gene Wan
*Assistant Examiner*—David Mis
*Attorney, Agent, or Firm*—Christensen, O'Connor, Johnson & Kindness

[57] ABSTRACT

A tracking loop having an enhanced ability to acquire a carrier signal and to remain locked on the carrier signal when the carrier frequency changes. The loop includes a nonlinear amplitude filter between the phase detector and the loop filter. The nonlinear amplitude filter receives the error signal e produced by the phase detector, and produces a modified error signal N for input to the loop filter. The nonlinear amplitude filter is designed such that N is an odd function of e, such that the derivative of N with respect to e is a constant k for comparatively small values of e, and such that the magnitude of N is greater than the product of k times the magnitude of e for relatively large values of e.

9 Claims, 7 Drawing Sheets

TRACKING LOOP HAVING NONLINEAR AMPLITUDE FILTER

FIELD OF THE INVENTION

The present invention relates to carrier tracking loops, such as phase lock loops, Costas loops and squaring loops. In particular, the present invention relates to a technique for decreasing the acquisition time and improving the tracking performance of such loops.

BACKGROUND OF THE INVENTION

Carrier tracking loops are often used to demodulate signals received from satellites or from other rapidly moving bodies such as missiles, rockets and airplanes. The signals received from such sources are subject to comparatively large doppler shifts in the carrier frequency. For this reason, the carrier tracking loops must be able to acquire and to remain locked onto a signal having a variable frequency carrier. The natural pull-in time of a second order phase lock loop is well approximated by:

$$T_a = \frac{(\Delta\omega)^2}{2\xi\omega_n^3} \quad (1)$$

where $\Delta\omega$ is the initial frequency offset between the loop center frequency and the incoming carrier frequency, $\zeta$ is the loop damping factor, and $\omega_n$ is the loop natural frequency. This approximation applies only where $\Delta\omega$ is much greater than the loop bandwidth.

The acquisition performance indicated in equation (1) can be enhanced using a dual time constant integrator technique, also called a variable bandwidth technique. In this approach, $\omega_n$ is large during signal acquisition, and is then reduced when the frequency error is reduced to some small value. This allows the loop signal to noise ratio to be improved during signal tracking. The dual time constant integrator scheme requires variable bandwidth filters, and offers only slight improvement in signal acquisition time, since making $\omega_n$ too large during acquisition results in too much reduction in the loop signal-to-noise ratio, and the loop misses acquisition completely. The dual time constant integrator scheme also requires a threshold detection circuit for determining the loop operating mode (acquisition or tracking), and for controlling the selection of loop bandwidth.

A second known method for acquisition time enhancement is to sweep the local oscillator frequency across the range of carrier frequency uncertainty. Although it is difficult to make general statements regarding the acquisition performance of swept local oscillator carrier tracking loops, the loop can acquire the signal with certainty only if the sweep rate D is less than 0.5 $\omega_n^2$. The approach is complicated by the circuitry needed to generate the periodic ramp waveform, and by the locking sensor for disabling the frequency sweep after acquisition occurs.

A third known method for acquisition time enhancement in carrier tracking loops uses a combined frequency discriminator-phase detector scheme. A number of different strategies are possible, such as using a phase detector and frequency detector, and adding these signals which in turn control the VCO, or using a phase frequency detector that produces an output voltage proportional to frequency when there is a frequency error, and when in lock produces a signal proportional to phase error. These acceleration techniques require relatively complicated circuitry and, in general, make it difficult to calculate acquisition time.

SUMMARY OF THE INVENTION

The present invention provides a tracking loop that is capable of rapidly acquiring a carrier signal, and of remaining locked to the carrier signal despite rapid changes of the carrier signal frequency. In most cases, the present invention can be implemented by adding a single component, a nonlinear amplitude filter, to an existing carrier tracking loop, without degrading the dynamic performance of the loop during normal locked conditions.

The tracking loop of the present invention receives a periodic carrier signal, and produces an output signal that is phase locked to the carrier signal. In a preferred arrangement, the tracking loop comprises an oscillator, a phase detector, a nonlinear amplitude filter, and a loop filter. The oscillator has input and output terminals, and means for producing the output signal at the output terminal at a frequency that is a function of an input signal applied to the input terminal. The phase detector receives the carrier and output signals, and produces an error signal e having a magnitude that is a function of the product of the carrier and output signal amplitudes, and of the phase difference between the carrier and output signals. The nonlinear amplitude filter receives the error signal e, and produces a modified error signal N. N is an odd function of e, the derivative of N with respect to e is a constant k for comparatively small valves of e, and the magnitude of N is greater than the product of k times the magnitude of e for relatively large values of e. The loop filter receives the modified error signal N, and produces the input signal to the oscillator.

DETAILED DESCRIPTION OF THE INVENTION

Figure 1:
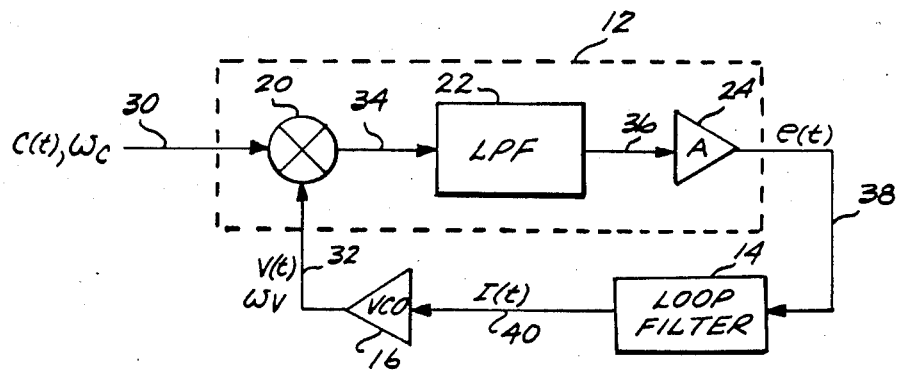
FIG. 1 is a block diagram of a convention phase lock loop for tracking a carrier signal.

An example of a known carrier tracking loop is the phase lock loop shown in FIG. 1. The phase lock loop includes phase detector 12, loop filter 14 and voltage controlled oscillator (VCO) 16. Phase detector 12 comprises four quadrant multiplier 20, low pass filter (LPF) 22, and amplifier (A) 24. The inputs to multiplier 20 are a carrier signal C(t) on line 30, and a VCO output signal V(t) on line 32. The frequencies of the carrier and output signals are $\omega_c$ and $\omega_v$ respectively. Multiplier 20 produces a signal on line 34 that includes components proportional to the sum $(\omega_c+\omega_v)$ and difference $(\omega_c-\omega_v)$ frequencies of the carrier and output signals. Low pass filter 22 eliminates the higher frequency sum signal, and produces a signal on line 36 having an amplitude proportional to the product of the amplitudes of the carrier and output signals, and to $\cos(\omega_c-\omega_v)t$. The signal on line 36 is amplified by amplifier 24 to produce an error signal e(t) on line 38. The error signal is integrated by loop filter 14, to produce input signal I(t) on line 40. Input signal I(t) is applied to the input terminal of VCO 16, and causes the frequency $\omega_v$ to change such that the output signal V(t) matches the phase and frequency of the carrier signal. It will be appreciated by those skilled in the art that amplifier 24 could be regarded as a separate loop component, or could be viewed as being distributed among phase detector 12, loop filter 14 and/or VCO 16.

Figure 2:
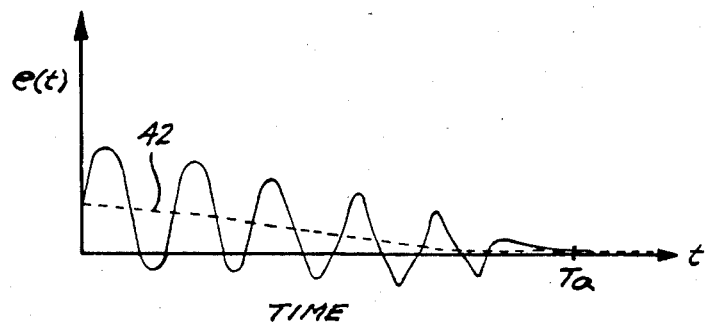
FIG. 2 is a schematic illustration of the acquisition process of a phase lock loop.

The acquisition process of the phase lock loop shown in FIG. 1 is schematically illustrated in FIG. 2. It is assumed that at t=0 the carrier signal C(t) is applied to the phase lock loop, and that the frequency $\omega_c$ of the carrier signal is different from the center frequency of VCO 16. As indicated in FIG. 2, the error signal e(t) oscillates about an average DC level 42, and level 42 is reduced in magnitude until the error signal becomes zero at acquisition time $T_a$. Subsequent to time $T_a$, the input to loop filter 14 is zero volts, and the integrated output of the loop filter is therefore a constant signal I(t) that causes VCO 16 to hold frequency $\omega_v$ at a constant value equal to $\omega_c$. It will be understood by those skilled in the art that the graph shown in FIG. 2 applies to the case in which the input frequency $\omega_c$ is constant. If $\omega_c$ is varying with time, such as in response to a variable doppler shift, then the error signal will have a non-zero DC value after acquisition.

The present invention provides a technique for improving the performance of carrier tracking loops, by decreasing the acquisition time for initially locking onto a carrier signal, and for increasing the ability of the tracking loop to follow frequency variations of the carrier signal. One preferred embodiment of the present invention is illustrated by the phase lock loop shown in FIG. 3. This phase lock loop is similar to the phase lock loop shown in FIG. 1, and includes phase detector 52, loop filter 54 and VCO 56. The phase detector comprises four quadrant multiplier 60, low pass filter (LPF) 62, and amplifier (A) 64. It will be appreciated by those skilled in the art that VCO could comprise a current controlled oscillator or, for a digital implementation, a numerical controlled oscillator (NCO) or a digitally controlled oscillator (DCO). All that is required is that the oscillator be capable of varying its output signal frequency based on a signal applied to its input terminal.

Figure 3:
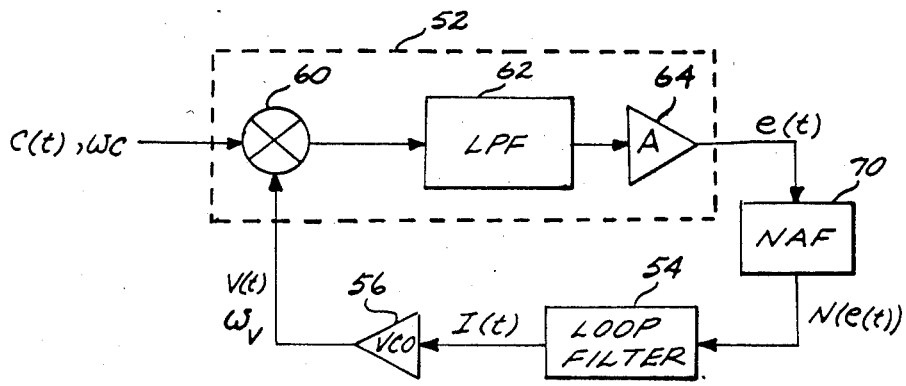
FIG. 3 is a block diagram of a phase lock loop according to the present invention.

In the embodiment shown in FIG. 3, a nonlinear amplitude filter (NAF), designated by reference numeral 70, is inserted in the loop between the phase detector and the loop filter. NAF 70 modifies the amplitude of the error signal e(t), to produce a modified error signal N(e(t)), in such a way as to improve the loop's acquisition and tracking capabilities. NAF 70 is designed such that N(e(t)) is an odd function of e(t), such that the derivative of N(e(t)) with respect to e(t) is a constant k for comparatively small values of e(t), and such that the magnitude of N(e(t)) is greater than the product of k times the magnitude of e(t) for relatively large values of e(t). A suitable general shape for the function N as a function of e is shown by curve 80 in FIG. 4, curve 80 having the approximate form of the analytic function:

$$N = e + e^3 \qquad (2)$$

Figure 4:
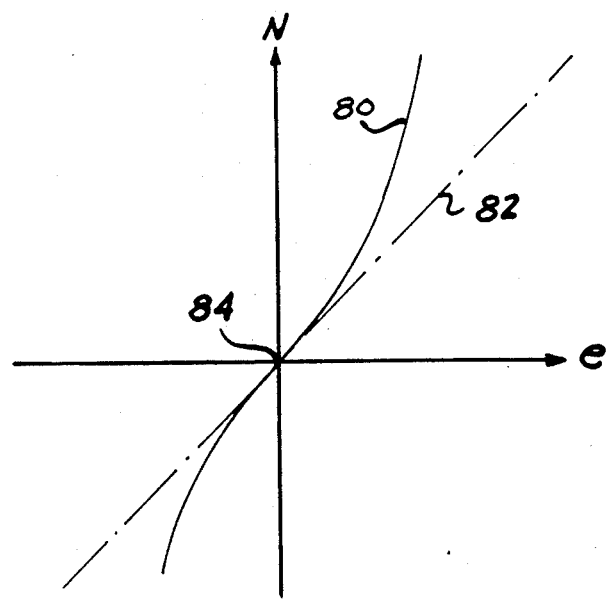
FIG. 4 is a graph showing the general form of the nonlinear amplitude filter function.

Curve 82 in FIG. 4 represents the first term of equation (2), i.e., N=e, and therefore represents that case in which NAF 70 produces no effect on the error signal. The effect of NAF 70 in the phase lock loop is thereby measured by the difference between curves 80 and 82 in FIG. 4. As can be seen, N is an odd function of e, i.e., symmetric about the origin. For small values of e near origin 84, N is approximately equal to e, and the slope of curve 80 is approximately equal to one. For relatively large values of e, N has the same sign as e, and a greater magnitude than e. In a preferred arrangement, the nonlinear amplitude filter is designed such that the ratio N/e increases monotonically as the magnitude of e increases.

Figure 5:
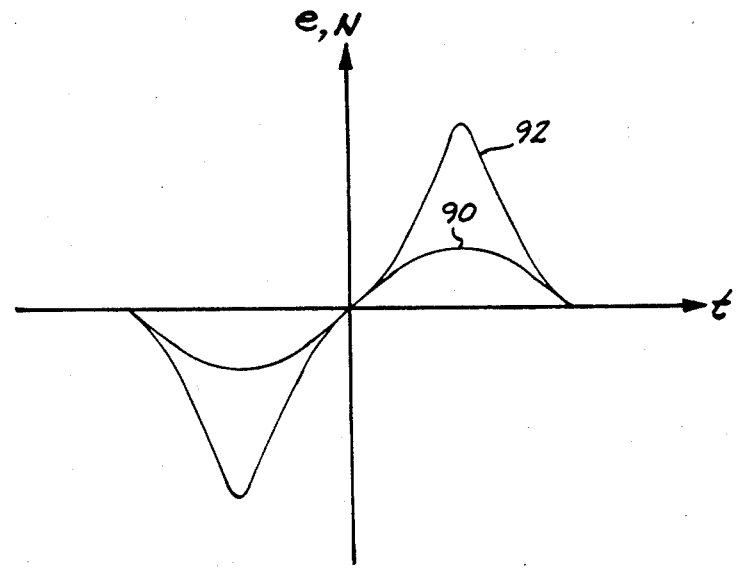
FIG. 5 is a graph illustrating the effect of the nonlinear amplitude filter on a sinusoidal waveform.

The effect of NAF 70 on a sinusoidal error signal is illustrated in FIG. 5. Curve 90 represents a sinusoidal error signal e(t) of the type that may be produced by the difference signal produced by phase detector 52. Curve 92 represents, in exaggerated form, the signal N produced by multiplying curve 90 by a curve such as curve 80 of FIG. 4. As in FIG. 4, for comparatively small values of e, the output of NAF 70 represented by curve 92 is essentially equal to the input represented by curve 90. However, for comparatively larger values of e, the amplitude of the error signal is increased to produce curve 92.

The theory behind NAF 70 is two-fold. First, by providing a linear, constant slope region for small values of e, the NAF has no significant effect on the dynamic characteristics of the loop in locked condition. Second, by increasing the magnitude of the error signal when the error signal is comparatively large, i.e., during signal acquisition, the NAF produces a larger error signal, and thereby drives the loop more rapidly towards the locked condition. In a preferred arrangement, the slope of curve 80, i.e., the derivative of N with respect to e, is equal to one for small values of e. The advantage of unity slope is that the nonlinear amplitude filter can be inserted into an existing carrier tracking loop without having any significant effect on loop dynamics during normal carrier tracking operations.

Figure 6:
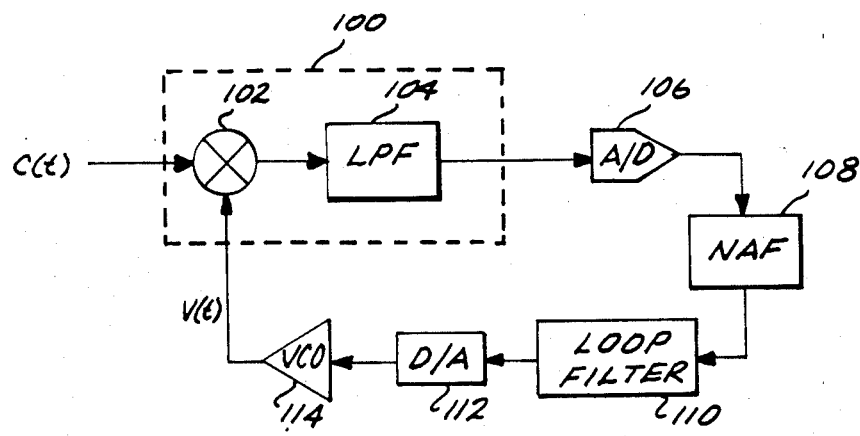
FIG. 6 is a block diagram of a phase lock loop having a digital nonlinear amplitude filter.

The carrier tracking loop shown in FIG. 3 is an analog phase lock loop, and uses an analog nonlinear amplitude filter. An embodiment utilizing a digital NAF is shown in FIG. 6. This embodiment includes phase detector 100 comprising analog multiplier 102 and low pass filter 104, analog-to-digital converter (A/D) 106, nonlinear amplitude filter (NAF) 108, digital loop filter 110, digital-to-analog converter (D/A) 112, and VCO 114.

Figure 7:
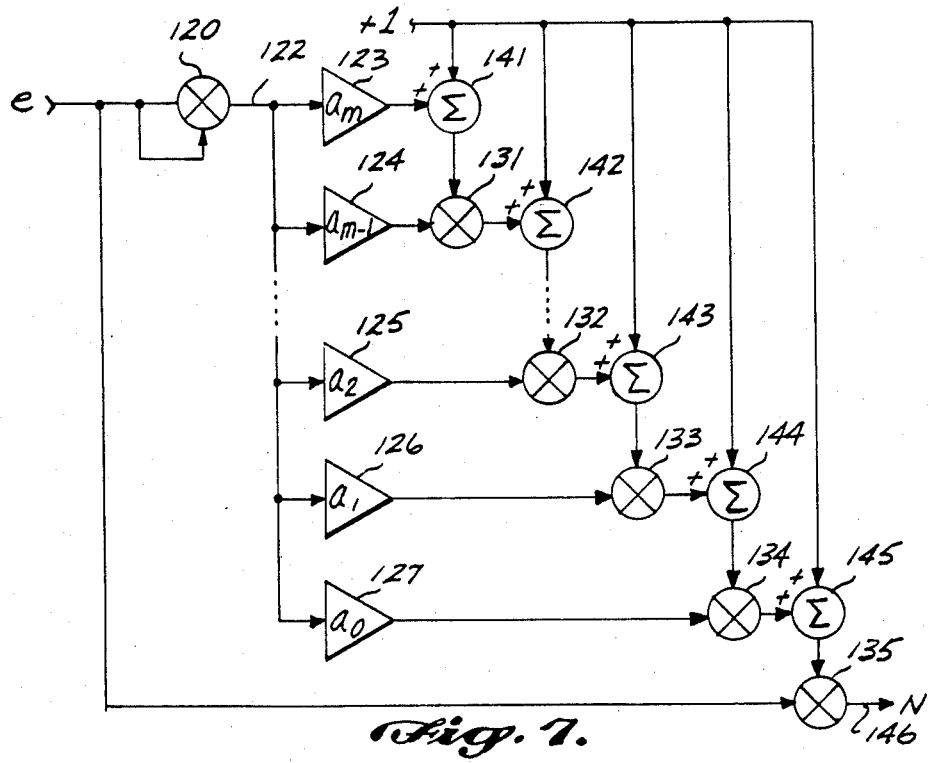
FIG. 7 is a block diagram of a nonlinear amplitude filter for use in the present invention.

A suitable implementation of analog NAF 70 in FIG. 3 or digital NAF 108 in FIG. 6 is shown in FIG. 7. This figure implements the equation:

$$N = e(1 + a_0 e^2(1 + a_1 e^2( \ldots a_m e^2))) \qquad (3)$$

where e is the error signal input to the NAF, N is the NAF output, and the values $a_i$ are the polynomial coefficients. In FIG. 7, multiplier 120 produces an $e^2$ signal on line 122 that is input to amplifiers 123-127 that represent the polynomial coefficients $a_0 \ldots a_m$. The amplifier outputs, together with the input signal e, are processed by multipliers 131-135 and summing junctions 141-145, to produce the output signal N on line 146. One can readily verify that the filter of equation (3) is an odd function of the input variable e, that the slope of the output with respect to the input is unity for small values of the input variable, that the magnitude of the output N is greater than the magnitude of the input for relatively large values of the input variable, and that the ratio of N/e increases monotonically as the magnitude of e increases.

Figure 8:
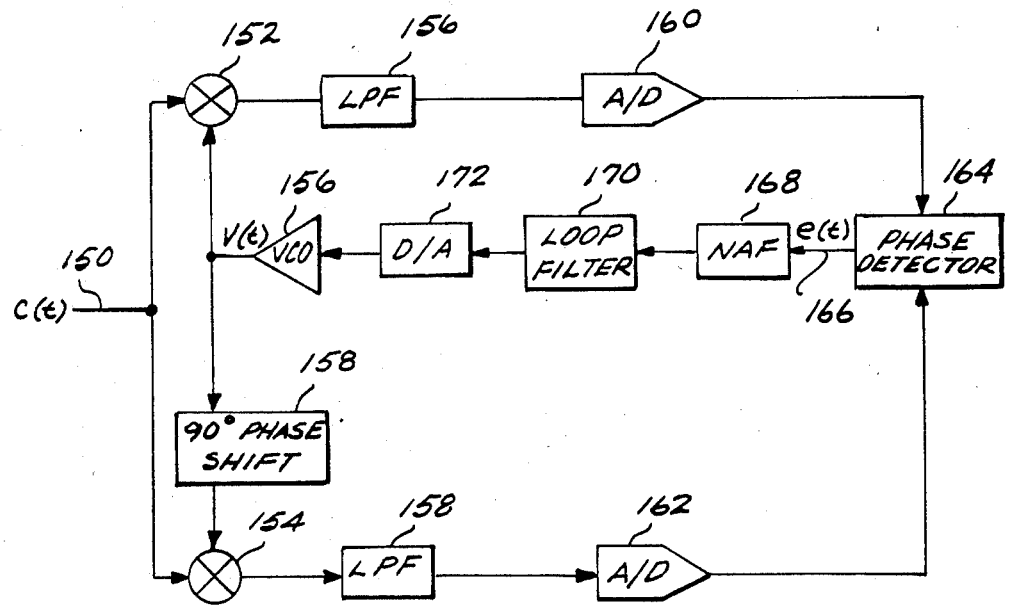
FIG. 8 is a block diagram of a Costas loop according to the present invention.
Figure 9:
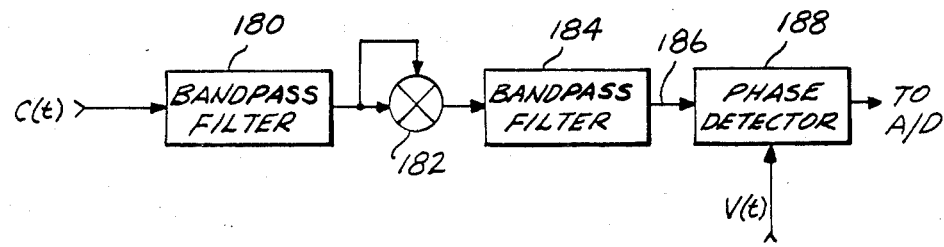
FIG. 9 is a partial block diagram of a squaring loop according to the present invention.

The applications of the principles of the present invention to suppressed carrier tracking loops are illustrated in FIGS. 8 and 9. A suppressed carrier loop is used in a communication system in which there is no residual carrier component to which a continuous wave (cw) loop can track. By using suppressed carrier modulation, all of the power is put into the data, and thereby no energy is wasted on a carrier component. FIG. 8 illustrates a suppressed carrier tracking loop commonly known as a Costas loop. In the Costas loop, the input carrier signal C(t) on line 150 is input to a pair of analog multipliers 152 and 154. The output V(t) of VCO 156 forms the second input to multiplier 152. The VCO output signal is shifted 90° by phase shifter 158, and the shifted signal forms the second input to multiplier 154. The outputs of multipliers 152 and 154 are input to low pass filters 156 and 158 respectively, the low pass filter outputs are digitized by analog-to-digital converters (A/D) 160 and 162 respectively, and the resulting digital signals are input to digital phase detector 164. The output of phase detector 164 produces the error signal e(t) on line 166 that is input to nonlinear amplitude filter (NAF) 168. As with the loop shown in FIG. 6, the output of NAF 168 is processed by loop filter 170 and digital-to-analog converter (D/A) 172, and the output of D/A 172 forms the input signal to VCO 156. The requirements for NAF 168 for the Costas loop shown in FIG. 8 are identical to those for the corresponding NAF for the phase lock loop shown in FIG. 6. The Costas loop effectively squares the input signal, and thereby forms a discrete frequency from which to track the incoming signal. In the Costas loop, the bandwidth of the two low pass filters must be large enough to pass the data.

FIG. 9 partially illustrates the application of the present invention in a second type of suppressed carrier tracking loop known as a squaring loop. In the squaring loop, the input carrier signal C(t) is passed through bandpass filter 180, a squaring circuit implemented by multiplier 182, and a second bandpass filter 184. The resulting modified carrier signal on line 186 is then input to phase detector 188, and the remainder of the carrier tracking loop is identical to that shown in FIG. 6 for a phase lock loop. In the squaring loop, a line spectrum is created at twice the carrier frequency. Bandpass filter 180 preceding the squaring device has a center frequency equal to twice the carrier frequency, and bandpass filter 184 removes the baseband signals generated by multiplier 182. The squaring process doubles any frequency uncertainties, as well as any doppler rates. Therefore the squaring loop, as well as the Costas loop, is more stressed than a cw loop for the same doppler dynamics.

Figure 10A:
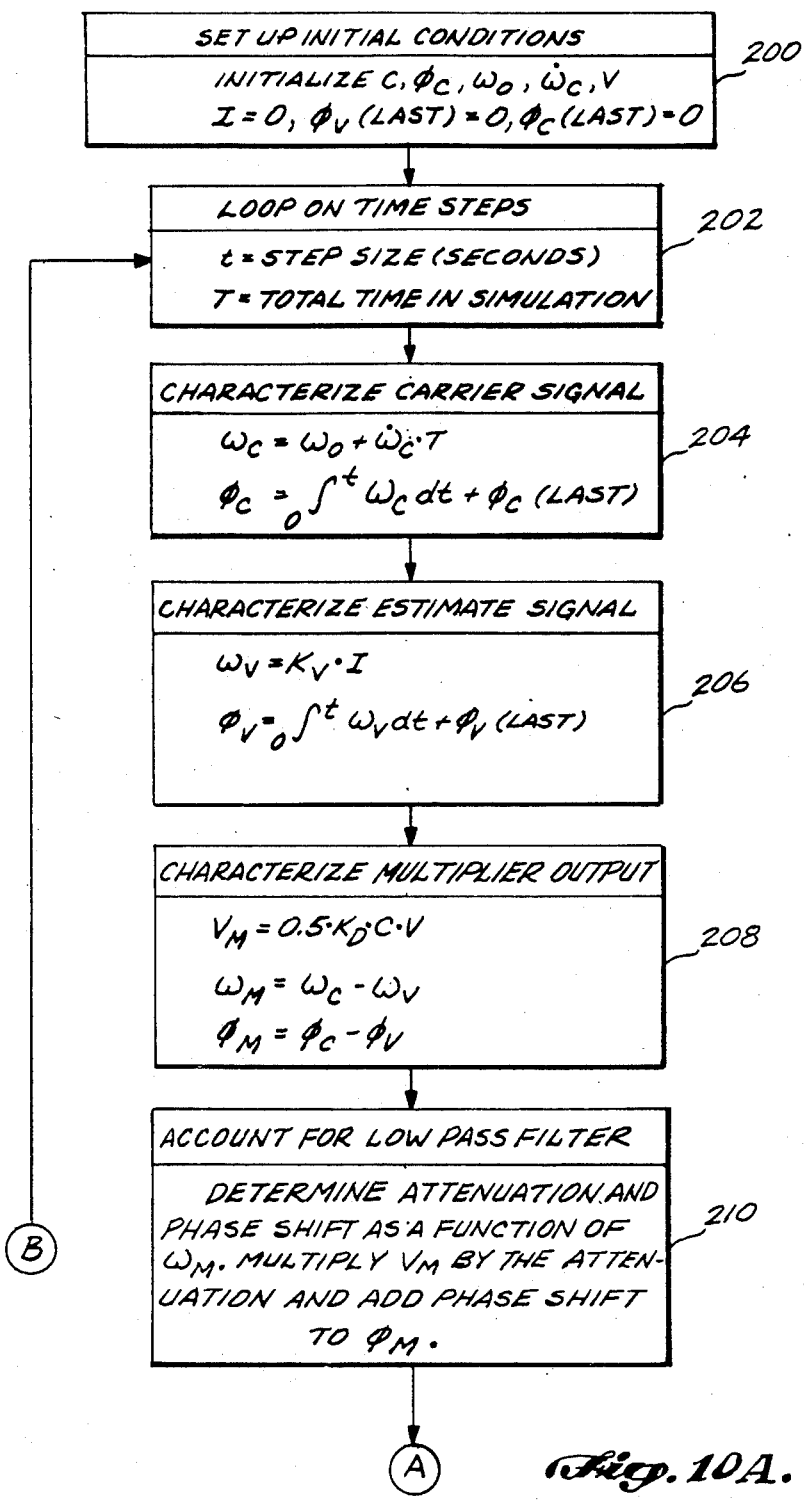
FIGS. 10a and 10b are a flow chart of a program for simulating a phase lock loop to determine suitable filter parameters; and, FIGS. 11 is a graph comparing the behavior of a tracking loop with and without a nonlinear amplitude filter.
Figure 10B:
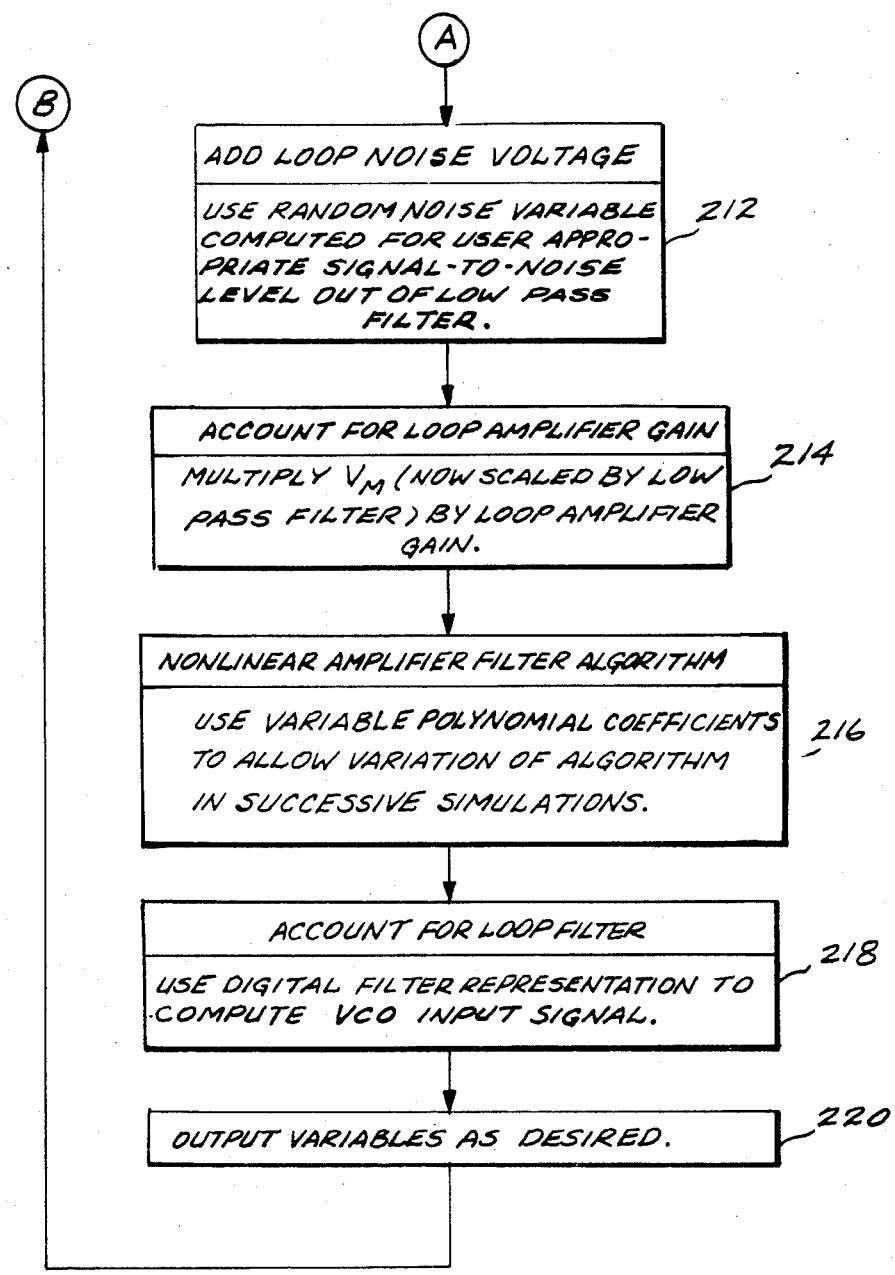

The optimum form for the nonlinear amplitude filter for a given application will depend on a number of variables, such as the maximum rate of frequency change of the carrier signal, the noise level, the performance criteria for the tracking loop, the particular implementation of the phase detector, loop filter and VCO, and other factors that will be apparent to those skilled in the art. In general, a preferred form for the nonlinear amplitude filter for an application can best be determined by simulation of the carrier tracking loop using a digital computer. An example of a suitable simulation program is outlined in FIGS. 10a and 10b. Block 200 of FIG. 10a sets up the initial conditions for the simulation. $\omega_0$ is the carrier frequency at the beginning of the simulation, and $\omega_c$ is the rate at which the carrier frequency changes, for example, due to a continuous rate of change in doppler shift. $\phi_v$ and $\phi_c$ are the phases of the VCO output signal and carrier signal respectively. Block 202 sets up the step size and total simulation time parameters and block 204 then characterizes the carrier signal by calculating $\omega_c$ and $\phi_c$, as indicated. Block 206 then characterizes the estimate signal V produced by the VCO, and block 208 simulates the operation of the multiplier by calculating the $V_M$, $\omega_M$ and $\phi_M$, the peak voltage, frequency and phase respectively of the multiplier output signal. The low pass filter is simulated in block 210, either by means of a look-up table or by an analytical calculation. Block 212 is then used to simulate the presence of noise in the output of a low pass filter. The low pass filter output is multiplied by the loop amplifier gain in block 214, and block 216 then implements the nonlinear amplitude filter. The program outlined in FIGS. 10a and 10b preferably permits the filter parameters to be varied, so that the simulation can determine preferred parameters for a given application. A digital filter is used to simulate the loop filter in block 218, and block 220 then outputs variables and returns to block 202 to perform the next step in the simulation.

Using the above-described simulation technique, a nonlinear amplitude filter was designed for a second order phase lock loop, of the type shown in FIG. 3, using a single pole loop filter. The loop had a bandwidth of 5 Hz and a loop damping coefficient of 1.0. As a result of the simulation, the following nonlinear amplitude filter was selected:

$$N = e(1 + 16e^2(1 + 128e^2(1 + 128e^2))) \tag{4}$$

Figure 11:
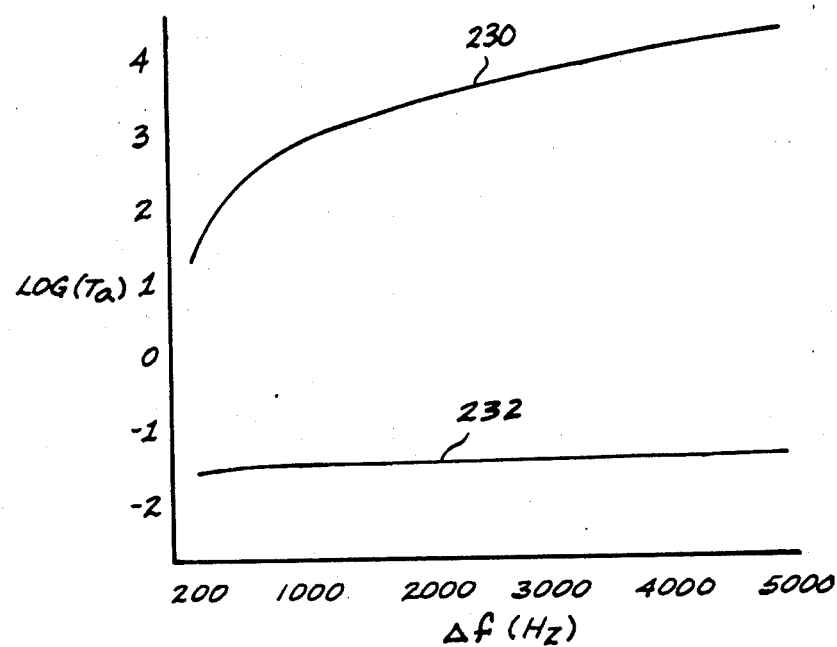

The acquisition time was then determined as a function of the initial frequency offset between the carrier frequency and the center frequency of the VCO, both with and without the presence of the nonlinear amplitude filter in the loop. The results are shown in FIG. 11. For this purpose, acquisition time was defined as the time required for the loop error signal to settle to a frequency of less than 1 Hz. The acquisition time performance of the loop without the nonlinear amplitude filter is represented by curve 230, and agrees with the performance of a conventional loop as documented in the prior art. Curve 232 shows the acquisition time as a function of frequency offset using the nonlinear amplitude filter of equation (4). At a frequency offset of 5000 Hz, the acquisition time without the nonlinear amplitude filter was 4.4 hours, and the acquisition time with the nonlinear amplitude filter was 30 ms. It can also be readily demonstrated that the loop represented by curve 232 in FIG. 11 has an enhanced ability to track a carrier signal having an extremely large rate of change. For the above example, the carrier was ramped at a rate of 50,000 Hz/second without loss of lock. Without the nonlinear amplitude filter, the loop will lose lock when the carrier rate of change exceeds 180 Hz per second.

While the preferred embodiments of the invention have been illustrated and described, variations will be apparent to those skilled in the art. Accordingly, the invention is not to be limited to the specific embodiments illustrated and described, and the scope of the invention is to be determined by reference to the following claims.

The embodiments of the invention in which an exclusive property or privilege is claimed are defined as follows:

1. A tracking loop for receiving a periodic carrier signal and for producing an output signal that is phase locked to the carrier signal, the tracking loop comprising:
    an oscillator having an input terminal, an output terminal, and means for producing the output signal at the output terminal at a frequency that is a function of an input signal applied to the input terminal;
    a phase detector connected to receive the carrier signal and the output signal, and to produce an error signal e having a magnitude that is a function of the product of the carrier and output signal amplitudes and of the phase difference between the carrier and output signals;
    a nonlinear amplitude filter connected to receive the error signal e and to produce a modified error signal N such that N is an odd function of e, such that the derivative of N with respect to e is a constant k for comparatively small values of e, and such that the magnitude of N is greater than the product of k times the magnitude of e for relatively large values of e; and
    a loop filter for receiving the modified error signal and for producing the input signal.

2. The tracking loop of claim 1, wherein the loop comprises a phase lock loop.

3. The tracking loop of claim 1, wherein the loop comprises a Costas loop.

4. The tracking loop of claim 1, wherein the loop comprises a squaring loop.

5. The tracking loop of claim 1, wherein the phase detector comprises an analog multiplier for receiving the carrier and output signals and producing a product signal, and a low pass filter for receiving the product signal and producing the error signal.

6. The tracking loop of claim 1, wherein the nonlinear amplitude filter is a digital filter, and wherein the tracking loop further comprises an analog-to-digital converter connected between the phase detector and the nonlinear amplitude filter, and a digital-to-analog converter connected between the loop filter and the oscillator.

7. The tracking loop of claim 6, wherein the nonlinear amplitude filter has a filter function in the form of a polynomial that includes only odd powers of e.

8. The tracking loop of claim 1, wherein the value of k is one.

9. The tracking loop of claim 1, wherein the nonlinear amplitude filter has a filter function such that the ratio of N/e increases monotonically as the magnitude of e increases.

* * * * *